(12) United States Patent
Haffner et al.

(10) Patent No.: US 6,631,511 B2
(45) Date of Patent: Oct. 7, 2003

(54) GENERATING MASK LAYOUT DATA FOR SIMULATION OF LITHOGRAPHIC PROCESSES

(75) Inventors: Henning Haffner, Dresden (DE); Armin Semmler, Munich (DE); Christoph Friedrich, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/949,511

(22) Filed: Sep. 7, 2001

(65) Prior Publication Data

US 2002/0083408 A1 Jun. 27, 2002

(30) Foreign Application Priority Data

Sep. 7, 2000 (DE) .......................................... 100 44 257

(51) Int. Cl.[7] .............................................. G06F 17/50
(52) U.S. Cl. .......................................... 716/21; 716/20
(58) Field of Search ................................ 716/2, 19, 20, 716/21

(56) References Cited

U.S. PATENT DOCUMENTS 6,289,499 B1 * 9/2001 Rieger et al. .................. 716/21
6,470,489 B1 * 10/2002 Chang et al. .................. 716/21

FOREIGN PATENT DOCUMENTS

DE          19747773 A1       4/1998    ............. G03F/1/00

* cited by examiner

*Primary Examiner*—Leigh M. Garbowski
*Assistant Examiner*—Thuan Do
(74) *Attorney, Agent, or Firm*—Fish & Richardson P.C.

(57) ABSTRACT

A method for generating mask layout data for lithography simulation includes prescribing original data defining an original layout of a mask and determining a deviation between the original layout and a subsequent layout of a mask derived from said original layout. On the basis of this deviation, new data defining a new layout is calculated. This new layout is more similar to the subsequent layout that it is to the original layout.

41 Claims, 5 Drawing Sheets

GENERATING MASK LAYOUT DATA FOR SIMULATION OF LITHOGRAPHIC PROCESSES

RELATED APPLICATIONS

This application claims the benefit of the priority date of German application DE 100 44 257.9, filed on Sep. 7, 2000, the contents of which are herein incorporated by reference.

FIELD OF INVENTION

The invention relates to lithographic processing, and in particular, to simulation of lithographic processes.

BACKGROUND

In the practice of lithography, original data defining an original layout are prescribed. New data are then automatically calculated proceeding from the original data. The calculation is effected in such a way that the new data define a new mask layout whose geometry is more similar to a mask produced or producible using the original data than it is to the original layout.

In the case of a known method carried out with the aid of the "Selid" program from Sigma-C, the successive steps of the production process for producing a photomask are simulated. Such steps include: writing the mask to a photoresist by means of a laser or electron beam writer; developing the photoresist; etching the mask; and performing reaction diffusion processes. The simulation of the mask production process requires an additional program that differs from the program used later for simulating exposure and resist development processes in a wafer. This additional program requires additional input parameters, some of which have to be determined experimentally in a complicated manner. Simulating the steps of the production process therefore requires additional expenditure of time and computation complexity, and significant data processing capability.

SUMMARY

It is an object of the invention to specify a simple method for generating mask layout data for lithography masks, in which method the new layout, with a reduced outlay, continues to be very similar to a mask that is produced using the original data. Moreover, the intention is to specify an associated apparatus and an associated program.

The invention is based on the recognition that deviations between a mask defined by a layout and either a mask produced according to this layout or a mask modeled proceeding from this layout with simulation of the production process can be attributed to the production process. These deviations depend on the geometry of the mask to be produced and can largely already be predicted on the basis of the geometry of the original layout. This makes it possible to rapidly take account of the influences of the production process while avoiding the need to simulate the individual steps of the production process In the case of the method according to the invention, in addition to the method steps mentioned in the introduction, the new data which are intended to be used for the lithography simulation are calculated on the basis of rules which are based on deviations in the geometry of a layout from a mask that is produced according to this layout. As an alternative to the production, the mask that is used for comparison purposes can also be modeled proceeding from the layout with simulation of the steps of the production process. In both cases, in the method according to the invention, the individual method steps of the production process of the mask are not simulated, however, during the calculation of the new data. The inputting of a multiplicity of process parameters for the simulation of the production process and the computationally complicated simulation itself are thus obviated.

The deviations in the geometry can be calculated by means of simple geometric relationships. Differential equations, such as e.g. diffusion equations, do not have to be solved. As a result, the new mask data can be calculated with a computation complexity that is reduced by orders of magnitude in comparison with the simulation of the production process.

In a development of the method according to the invention, the rules are geometric calculation specifications for defining the boundaries of a structure at a position of the new layout depending on the length and/or the area of a reference structure located at the same position in the original layout. Alternatively or cumulatively, the distance between the reference structure and the adjacent structures of the original layout is also included in the calculation specification. The length and the area of a structure determine the extent of the deviations to be determined. The adjacent structures allow conclusions to be drawn regarding the locations at which deviations will occur. This is because different effects occur during the mask writing process of closely adjacent structures than during the writing of adjacent structures at a greater distance from the reference structure.

Figure 2:
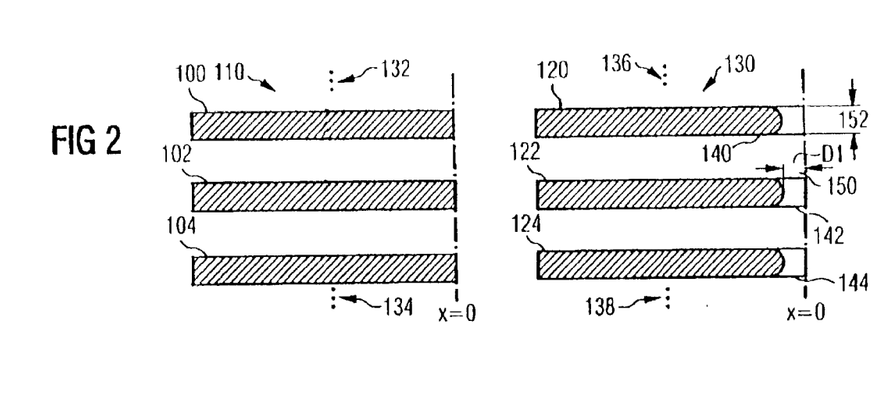
FIG. 2 shows the effects of "line shortening" and "corner rounding" using structures in the center of an original layout.
Figure 3:
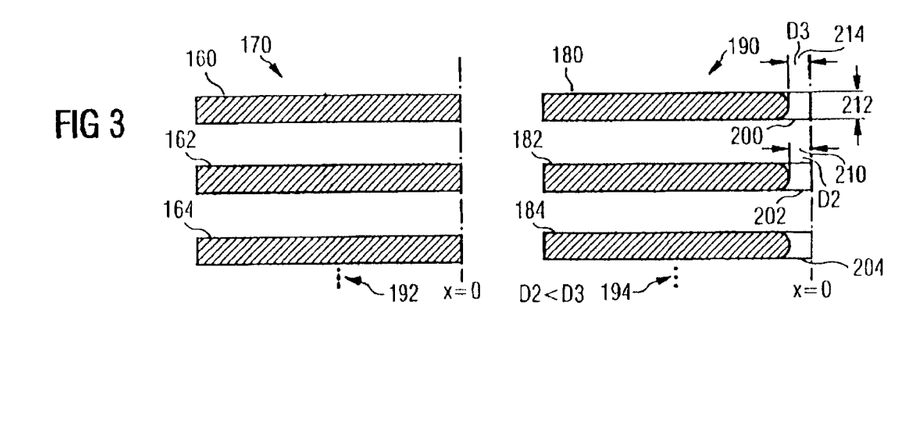
FIG. 3 shows the effect of intensified "line shortening" at the edge of a structure of an original layout.
Figure 4:
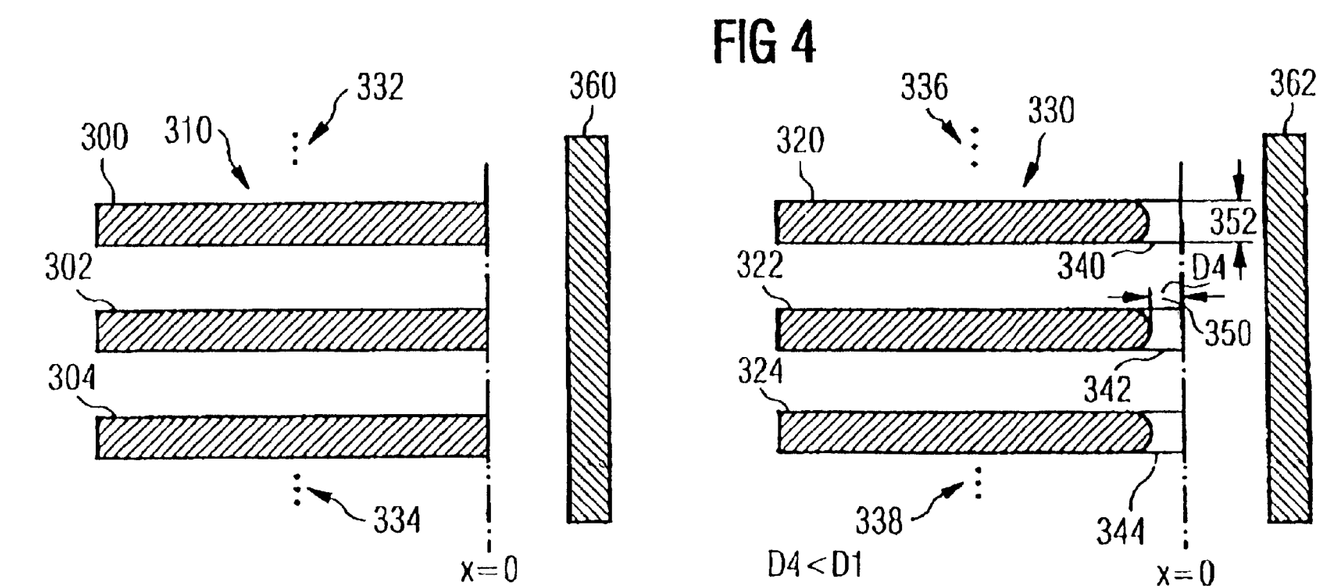
FIG. 4 shows the effect of reduced "line shortening" on account of an adjacent structure.

In one refinement, in accordance with a rule, a shortening value is determined for an elongate reference structure, which is also referred to as a line structure or as a line for short, at a position of the original layout. Depending on the shortening value, the structure located at the same position in the new layout is shortened in the longitudinal direction in comparison with the reference structure. The line shortening can be attributed to the absence of adjacent structures. Thus, the nature of the line shortening and the extent of the line shortening can be determined on the basis of the geometry of the original layout. Instances of line shortening are illustrated in FIGS. 2 to 4, which are explained in more detail below.

In another refinement, in accordance with a further rule, a cornered reference structure is determined at a position of the original layout. A corner can be defined with the aid of the angle between two meeting lines or straight edges. In a customary design the structures often have corners whose edges are at an angle of 90° with respect to one another (however, any desired angles are also conceivable). For the purpose of rounding a corner, at least one radius or curvature value is determined or input by an operator. Depending on the radius or curvature value, the new data are calculated in such a way that the structure located at the same position in the new layout has a rounded edge profile instead of the corner. The radius value can be determined, for example, directly from the width of a structure. The circle equation, for example, can then be used for calculating the position of the structure in the new layout. Instances of corner rounding are explained below with reference to FIGS. 2 to 5.

In one refinement, the radius is chosen depending on the surroundings. In the case of a light-absorbing structure which is arranged around a light-transmissive structure, an inner corner is rounded with a smaller radius than an outer corner of the light-absorbing structure.

In a further refinement, in accordance with a rule, a constriction value is determined for an elongate reference structure at a position of the original layout. Depending on the constriction value, the structure located at the same position in the new layout is then constricted at least in sections transversely with respect to the longitudinal direction in comparison with the reference structure. This measure takes account of the so-called "peanuts" effect because constrictions of structures are simulated which can be attributed to the absence of adjacent structures during the production of the mask. The "peanuts" effect is explained below with reference to FIG. 7.

In a second aspect, the invention relates to a method for generating optimized mask layout data for photomasks. In the method in accordance with the second aspect, original data which define an original layout for the simulation of a lithography method are again prescribed. Proceeding from the original data, new data are calculated automatically or in another way. The new data define a new layout which is more similar, with regard to the geometry, to a mask that is produced or can be produced using the original data than to the original layout.

By way of example, the new data can be calculated by simulation of the method steps during the production of the mask. As an alternative, however, the method in accordance with the first aspect or in accordance with one of the abovementioned developments and refinements can also be used in order to define the new data.

It is an object of the second aspect of the invention to specify a simple method for generating optimized mask layout data for photomasks. Furthermore, the intention is to specify an associated apparatus and an associated program.

The invention in accordance with the second aspect proceeds from the consideration that taking account of the influence of the production process of the mask is only a partial step on the way to defining final mask layout data which are then actually used for the mask production. This is because the changes that occur through the production process in turn require a change of the original layout in a corrected layout. These changes have hitherto been carried out manually, but can also be automated.

In the invention's method in accordance with the second aspect, corrected data are automatically defined proceeding from the new data in such a way that a corrected mask that is produced or can be produced using the corrected data is more similar, with regard to the geometry, to the original layout than to a mask that is produced or can be produced using the original data. Consequently, the original layout is considered as the aim of the production process of the mask. The reference to the original layout allows the definition of simple criteria for the automatic correction.

Alternatively or cumulatively, in the method in accordance with the second aspect, the corrected data are designed in such a way that the mask that is produced or can be produced using the corrected data has better lithographic imaging properties than a mask that is produced or can be produced using the original data. The lithographic imaging properties are of fundamental importance for the structure widths that can be achieved during the wafer exposure. The chip production yield can be considerably increased by virtue of the improved imaging with a mask produced from the optimized mask layout data. Moreover, it is thus possible to produce chips having a greater electrical performance, e.g. with regard to a higher clock frequency or a lower current consumption.

One criterion for the automatic correction is, in one development, the ratio of the dark areas and of the bright areas of the original layout. In the corrected layout, this ratio is to be preserved or changed by a prescribed value. And this is because the area ratio is initially changed in the new layout on the basis of the effects that are taken into account.

In one development, the corrected layout data are calculated on the basis of correction rules which are based on deviations in the geometry of a layout from a mask that is produced according to this layout or a mask that is modeled proceeding from this layout with simulation of the production process. The fact that the deviations in the geometry are taken into account already means that it is possible to define so many correction rules that the correction can be completely or almost completely automated.

In one refinement, the method discussed above in connection with the shortening value is used for defining the new data. In accordance with a correction rule, depending on the shortening value, a lengthening value is then determined for a reference structure at a position of the original layout. Depending on the lengthening value, the structure located at the same position in the corrected layout is subsequently lengthened in the longitudinal direction in comparison with the structure located at the same position in the new layout. The aim here is to approximate to the structure prescribed by the original layout at the same position. This is done in an iteration method, for example. However, it is also possible to use approximation specifications. A correction method is explained below with reference to FIG. 8.

In a further refinement, use is made of the method discussed above in connection with the radius or curvature value. In accordance with a further correction rule, depending on the radius or curvature value, a lengthening value is then determined for a reference structure at a position of the original layout. Depending on the lengthening value, the structure located at the same position in the corrected layout is subsequently lengthened in the longitudinal direction and/or in the transverse direction in comparison with the structure located at the same position in the new layout. In this refinement, instances of shortening which are brought about by the rounding of the corners are compensated for again.

In a next refinement, in accordance with a further correction rule, depending on the constriction value, a widening value is determined for a reference structure at a position of the original layout. The abovementioned development of the method in accordance with the first aspect of the invention is used for determining the constriction value. Depending on the widening value, the structure located at the same position in the corrected layout is then widened at least in sections transversely with respect to the longitudinal direction in comparison with the structure located at the same position in the new layout. What is achieved by this measure, despite the "peanuts" effect, is that the corrected mask contains a structure having a constant or intended width.

In addition to the abovementioned refinements, other correction rules are also used for correcting the consequences of other effects. In this case, simple geometric relationships are utilized each time.

In one development, the lengthening and/or the widening is implemented whilst maintaining the form of the structure in the new mask. As an alternative, however, simple structures can also be attached in the course of the lengthening or widening. By way of example, if the intention is to correct instances of rounding, then small squares are attached to the structure of the original mask to the left and right of a central axis, in order to obtain the corrected structure. The structure thus obtained a serif-shaped configuration, as known previously from OPC methods (Optical Proximity Correction—correction of proximity-induced diffraction effects). Known OPC methods take account, in particular, of the exposure process of the wafer. By contrast, the method according to the invention essentially takes account of the effects which are brought about by the mask writer and the mask production process.

The invention additionally relates to an apparatus, in particular a data processing system, for generating mask layout data for lithography simulation or for generating optimized mask layout data for photomasks. However, use is also made of circuit arrangements or special hardware in a data processing system. The apparatus is constructed in such a way that the method steps according to one of the methods in accordance with the first aspect or in accordance with the second aspect or in accordance with the developments thereof are implemented during operation. Thus, the technical effects mentioned above also apply to the apparatus.

Furthermore, the invention relates to a program having a command sequence that can be executed by a data processing system. The method steps in accordance with the first aspect or in accordance with the second aspect or in accordance with a development of one of these aspects are implemented during the execution of the command sequence. The program is held for example in a RAM module (Random Access Memory) in a programmable memory module, on a floppy disc or on a compact disc, abbreviated to CD.

BRIEF DESCRIPTION OF THE FIGURES

Exemplary embodiments of the invention are explained below with reference to the accompanying drawings, in which.

DETAILED DESCRIPTION

Figure 1:
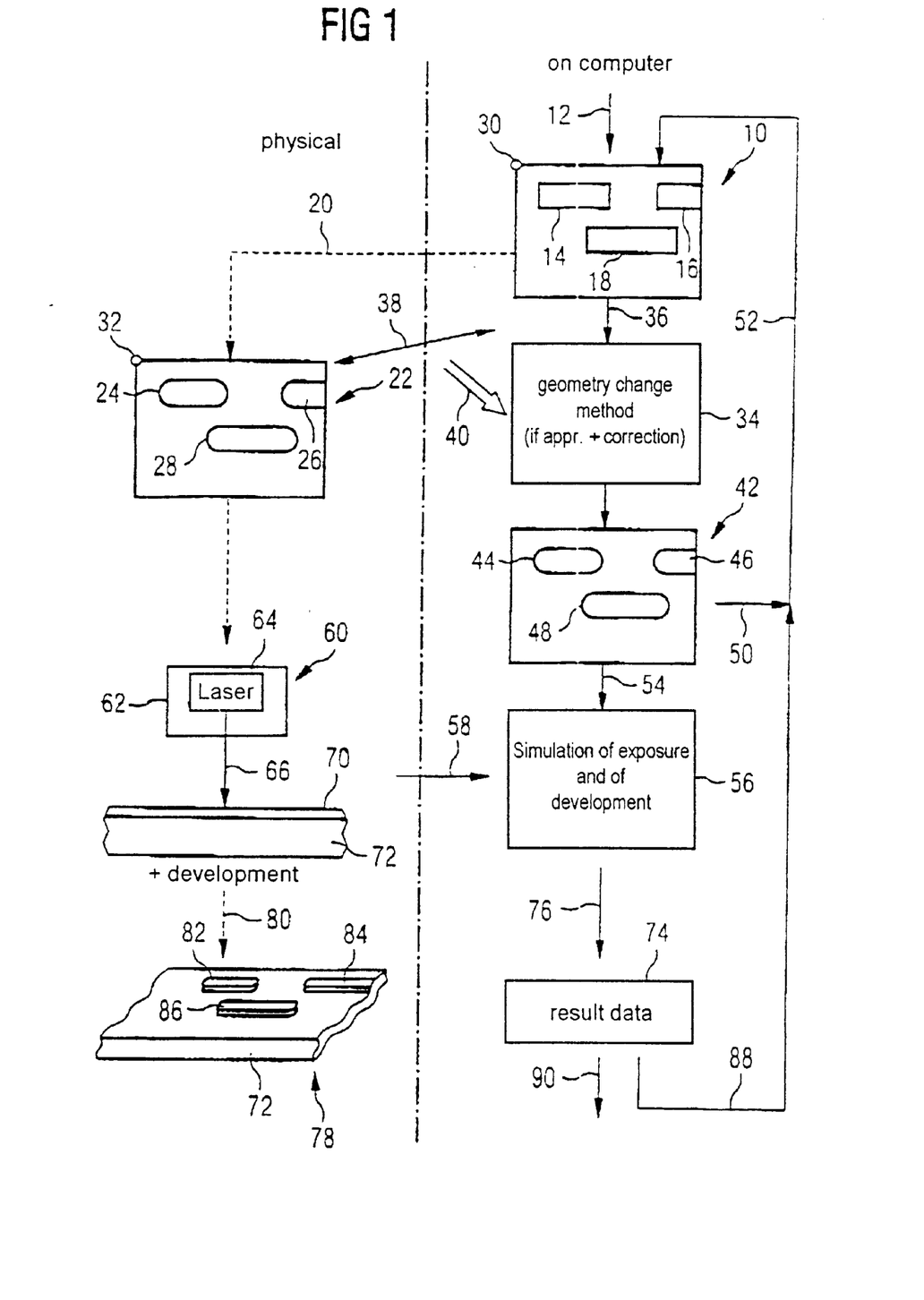
FIG. 1 shows a basic illustration of wafer lithography and lithography simulation and also of method steps for generating the layout data for a lithography mask.

FIG. 1 shows a basic illustration of the wafer lithography and lithography simulation and also the method steps for generating the layout data for a photomask that is utilized during the production of integrated circuits. It is assumed that an original layout 10 and original-layout data 12 defining this original layout 10 have been prescribed. The data format is suitable for inputting into a program for simulation of the lithography process proceeding from the original layout data. Examples of such programs are the "Solid-C" program from Sigma-C or the "Prolith" program from Finle.

The original-layout data 12 are prescribed, for example, by an upstream development department depending on the basis of the electrical properties of the circuit. An integrated circuit produced in an ideal production process in accordance with the original layout 10 would thus satisfy the electrical requirements. However, during a real production process, deviations begin to occur even as early as during the production of a mask proceeding from the original layout 10.

An exemplary original layout 10, shown in FIG. 1, contains three rectangular dark structures 14, 16 and 18. An arrow symbolizes the production process 20 of a mask proceeding from the original-layout data 12 of the original layout 10. A mask 22 having three dark structures 24, 26 and 28 is produced. These dark structures 24, 26 and 28 are dimensioned, for example, on the order of 100 nanometers. The structures 24, 26 and 28 are located in this order in the mask 22 at the same position as the structures 14, 16 and 18 in the original layout 10. By way of example, the top left corner 30 of the original layout 10 and the top left corner 32 of the mask 22 can be used as a reference point.

The original layout 10 still has to be corrected. However, to reduce costs, however, no production process 20 is implemented. Instead, a geometry-change method 34 is implemented. This geometry-change method 34 accounts for the influences of the production process 20 on the mask 22. The geometry-change method 34 is stored, for example, in a program for a data processing system. The inputs 36 for the geometry-change method 34 include original-layout data 12 of the original layout 10. In addition, during the creation of the program for realizing the geometry-change method 34, rules were stored in the program. These rules account for general deviations between the geometry of the the mask 22 and that of the original layout 10 that occur during the production of a mask. Such deviations can include: the rounding of the corners during the production of the mask 22, (see arrows 38 and 40), line shortening, constrictions of an elongate structure in specific sections, (referred to as the "peanuts" effect), rounding of corners, and CD (critical dimension) linearity.

During the implementation of the geometry-change method 34, the deviations are calculated on the basis of the prescribed rules. These rules account for the extent and the area of the respective processed structure 14, 16 or 18 and also the influence of adjacent structures 16 to 18.

The result of the implementation of the geometry-change method 34 is layout data of a new mask layout 42 that includes dark structures 44, 46 and 48 corresponding to the structures 14, 16 and 18. In this context, "corresponding" means that a structure in the original layout 10 is located at the same position as the corresponding structure in the new mask layout 42. The structures 44, 46 and 48 have, for example, rounded corners and are shortened in comparison with the structures 14, 16 and 18, respectively. This line shortening will be explained in more detail below with reference to FIGS. 2 to 4. The structures 44, 46 and 48 have forms very similar to the structures 24, 26 and 28 of the mask 22.

In the first exemplary embodiment, the new mask layout 42 is corrected manually to better meet the requirements of the upstream development department. Corrected layout data 50, 52 are subsequently used instead of the original-layout data 12 of the original layout 10. By means of single or multiple iteration, one or more new mask layouts are produced instead of the new mask layout 42. The data of the last new mask layout will be used for the simulation of the exposure and development during the processing of a wafer (see arrow 54 and method step 56). By way of example, one of the programs "Solid-C" and "Prolith" already mentioned is used for the simulation.

Prior to the simulation, parameters 58 that characterize an exposure process 60 and a development process 61 of the wafer processing must be input into the program. The exposure process 60 would typically be carried out by an exposure apparatus 62, which may still be in the development stage at the time of the simulation 56. In this case, the parameters set as development aims should be input instead of actual parameters. The exposure apparatus 62 contains, for example, a laser unit 64 for generating a laser beam 66 that images the structures on the mask, by means of an optical arrangement, usually in a manner reduced in size, onto a silicon wafer 72 coated with a photoresist layer 70. During the simulation 56, the method steps of the exposure process 60 and of the development process 61 of the photoresist are simulated by calculations made with the aid of equations that describe the physical processes taking place.

At the end of the simulation 56, results data 74 are output (see arrow 76). The results data 74 represent a resist pattern that essentially corresponds to a resist pattern 78 of the kind that might actually be produced with the aid of the exposure apparatus 62 and the development process 61 (see arrow 80). Elongate photoresist structures 82, 84 and 86, corresponding in this order to the structures 14, 16 and 18, remain on the silicon wafer 72.

Proceeding from the result data 74, further corrections of the layout data are often necessary (see arrows 88 and 52). After one or more iterations, result data suitable for the simulation of further method steps during the production of an integrated circuit are generated (see arrow 90). By way of example, the etching of the silicon wafer 72 is subsequently simulated.

In a second exemplary embodiment, the correction is also carried out automatically in the context of the geometry-change method 34. By way of example, during the correction: instances of line shortening are eliminated by lengthening the relevant structures; instances of corner-rounding are avoided by "attaching" correction areas, and constrictions on account of the "peanuts" effect are widened.

During the implementation of the geometry-change method 34, one or more iterations are automatically carried out in the second exemplary embodiment (see arrows 50 to 52). The automatic correction is explained in more detail below with reference to FIG. 8.

FIG. 2 shows the effects of "line shortening" and "corner rounding" using structures 100, 102 and 104 of an original layout 110 and, corresponding to those structures, structures 120, 122 and 124 of a new mask layout 130. A broken line shows the value x=0 at which the mutually parallel structures 100, 102 and 104 begin. Points 132 and 134 indicate that the structures 100, 102 and 104 shown are adjoined above and below by further parallel structures (not shown). Points 136 and 138 illustrate the same facts for the structures 120, 122 and 124. The new mask layout 130 is generated from the layout data of the original layout 110 by having the geometry-change method 34 account for influences of the production process for real masks. Consequently, the new mask layout 130 is similar to a mask produced with the aid of the original layout 110. Lines 140, 142 and 144 show the original profile of the structures 100, 102 and 104 in the new mask layout 130. A broken line again shows the value x=0.

The line shortening is identical for the three structures 120, 122 and 124 that are arranged parallel to one another at the same distance so that only the shortening and the corner rounding for the structure 122 are explained below. In comparison with the structure 102, the structure 122 is shortened at one end by a difference value D1 to which a distance 150 corresponds. The shortening takes account of the influence of the production process during the production of a mask from the layout data of the original layout 110. Moreover, the ends of the structures 120, 122 and 124 shown in FIG. 2 have been rounded to account for the influence of the production process. A radius-of-curvature for the rounding is independently determined during the implementation of the geometry-change method 34. This radius-of-curvature corresponds to half the structure width 152 in this exemplary embodiment.

FIG. 3 shows the effect of intensified "line shortening" at the edge of a structure of an original layout 170 in comparison with a new mask layout 190. The effect is explained using structures 160, 162 and 164 of the original layout 170 and corresponding to those structures, structures 180, 182 and 184 of the new mask layout 190. A broken line shows the value x=0 at which the mutually parallel structures 160, 162 and 164 begin. Points 192 indicate that the structures 160, 162 and 164 shown are adjoined by further parallel structures below (not shown). Points 194 illustrate the same facts for the structures 180, 182 and 184. The structures 160, 162 and 164, and 180, 182 and 184, are not adjoined by any structures above. The new mask layout 190 is generated from the layout data of the original layout 170 by having the geometry-change method 34 account for influences of the production process on real masks. Consequently, the new mask layout 190 is similar to a mask produced with the aid of the original layout 170. Lines 200, 202 and 204 show the original profile of the structures 100, 102 and 104 in the new mask layout 190. A broken line again shows the value x=0.

The greatest degree of line shortening is that for the structure 180. For the two structures 182 and 184, the line shortening is approximately identical. In comparison with the structure 162 or 164, the structure 182 or 184, respectively, is shortened at one end by a difference value D2 to which a distance 210 corresponds. The difference value D2 has approximately the same value as the difference value D1. By contrast, in comparison with the structure 160, the structure 180 is shortened by a difference value D3 greater than the difference value D1, see distance 214. The shortening accounts for the influence of the production process during the production of a mask from the layout data of the original layout 110. In particular, the greater shortening of the structure 180 shows that there are no further structures arranged above this structure. Moreover, the ends of the structures 180, 182 and 184 shown in FIG. 3 have been rounded to account for the influence of the production process. A radius-of-curvature for the rounding is determined independently during the implementation of the geometry-change method 34. This radius-of-curvature corresponds to half the structure width 212 in this exemplary embodiment.

FIG. 4 shows the effect of reduced "line shortening" on account of an adjacent structure 360 and 362, respectively, using structures 300, 302 and 304 of an original layout 310 and corresponding to those structures, structures 320, 322 and 324 of a new mask layout 330. A broken line shows the value x=0 at which the mutually parallel structures 300, 302 and 304 begin. Points 332 and 334 indicate that the structures 300, 302 and 304 shown are adjoined by further parallel structures (not shown) above and below those structures. Points 336 and 338 illustrate the same facts for the structures 320, 322 and 324. The structure 360 lies transversely with respect to the structures 300, 302 and 304 at a distance from the beginning of these structures that corresponds to the distance between adjacent structures 300, 302 and 304. The structure 362 lies transversely with respect to the structures 320, 322 and 324 at a distance from the beginning of these structures that corresponds to the distance between adjacent structures 320, 322 and 324.

The geometry-change method 34 generates the new mask layout 330 from the layout data of the original layout 310 by accounting for influences of the production process for real masks. Consequently, the new mask layout 330 is similar to a mask produced with the aid of the original layout 310. Lines 340, 342 and 344 show the original profile of the structures 300, 302 and 304 in the new mask layout 330. A broken line again shows the value x=0.

The line shortening is identical for the three structures 320, 322 and 324 that are arranged parallel to one another at the same distance, so that only the shortening and the corner rounding for the structure 322 are explained below. In comparison with the structure 302, the structure 322 is shortened at one end by a difference value D4 to which a distance 350 corresponds. The shortening accounts for deviations introduced by the production process during the production of a mask from the layout data of the original layout 110. On account of the structure 360 or 362, respectively, the difference value D4 is less than the difference values D1 or D2 shown in FIGS. 2 and 3, respectively.

Moreover, the ends of the structures 320, 322 and 324 shown in FIG. 4 have been rounded in order to take account of the influence of the production process. A radius-of-curvature for the rounding is determined independently during the implementation of the geometry-change method 34. This radius corresponds to half the structure width 352 in this exemplary embodiment.

Figure 5:
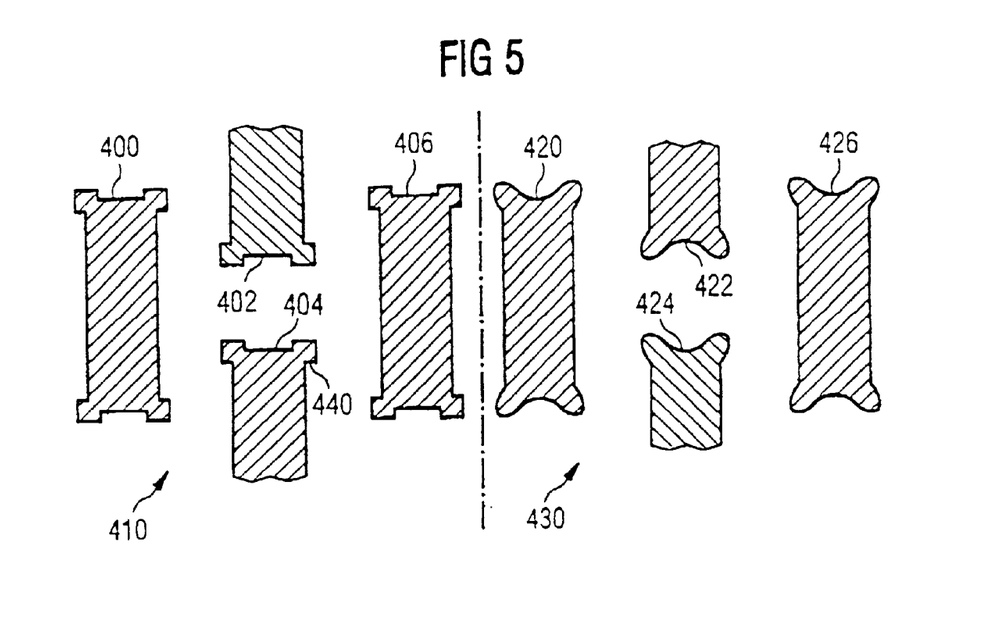
FIG. 5 shows the effect of "corner rounding" in the case of structures having irregular borders.

FIG. 5 shows the effect of "corner rounding" in the case of structures 400 to 406 of an original layout 410 having borders that are irregular compared to those of structures 420 to 426 of a new layout 430 calculated with the aid of the geometry-change method 34. The structures 400 to 406 have serifs 440 at the corners. The serifs 440 were attached to originally rectangular structures in an OPC method. In the structures 420 to 426, these serifs 440 have been rounded.

Figure 6:
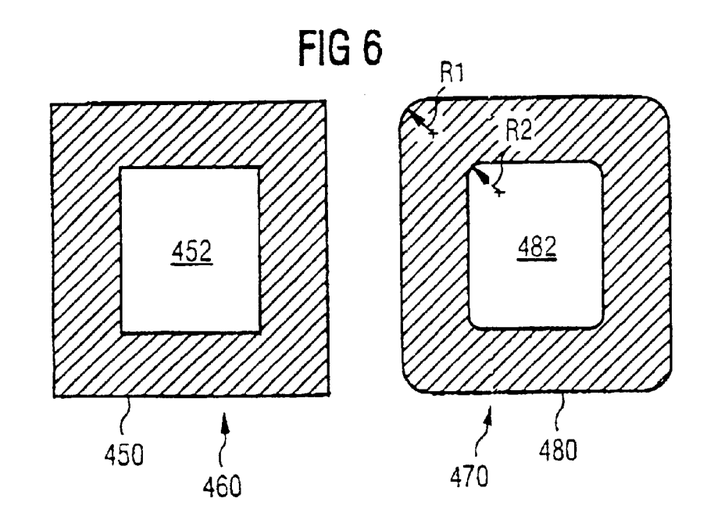
FIG. 6 shows the effect of "corner rounding" in the case of a dark structure which surrounds a bright structure.

FIG. 6 shows the effect of "corner rounding" in the case of a dark structure 450 surrounding a bright rectangular structure 452. Both structures belong to an original layout 460. A new mask layout 470 containing structures 480 and 482, corresponding to the structures 450 and 452 respectively, was calculated on the original layout 460 with the aid of the geometry-change method 34. The outer corners of the dark structure 480 are rounded with a radius R1 that is greater than a radius R2 that rounds the inner corners of the structure 480.

Figure 7:
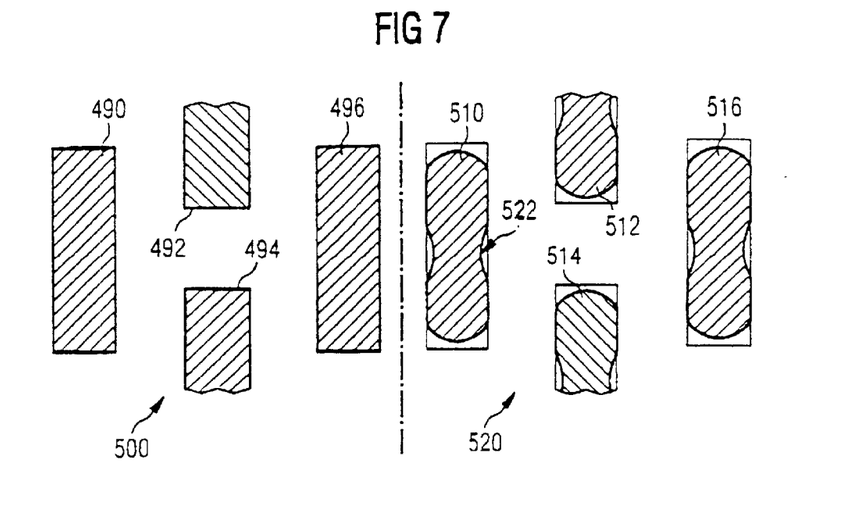
FIG. 7 shows the "peanuts" effect.

FIG. 7 shows the so-called "peanuts" effect using rectangular structures 490 to 496 of an original layout 500 in comparison with structures 510 to 516 of a new mask layout 520 which has been calculated from the original layout 500 with the aid of the geometry-change method 34. The structures 510 to 516 display constrictions 522 in their central sections. The constrictions 522 can be attributed to the absence of closely adjacent structures.

Figure 8:
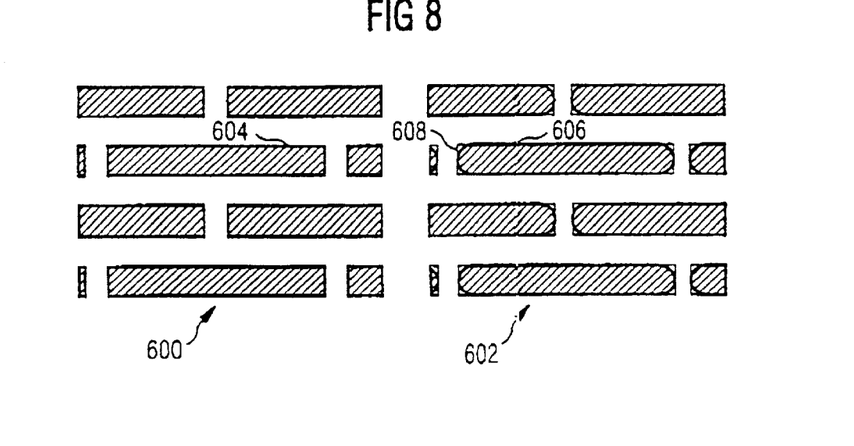
FIG. 8 shows an original mask and also a mask that is calculated therefrom and corrected with regard to the effect of line shortening.

FIG. 8 shows an original layout 600 and a new mask layout 602 whose mask data have been calculated by iterative application of the geometry-change method 34. In the course of this calculation, the change of structures of the original layout 600, e.g. of the structure 604, on account of the production method are first calculated. These changes led to a first new mask layout (not illustrated). The layout data was subsequently corrected proceeding from the first new mask layout. The new mask layout 602 was then calculated from the corrected layout data by repeated implementation of the geometry-change method 34.

The layout data were corrected in such a way that the areas of the dark structures 604 and 606 are identical. This is possible if the rounded portions of the structure 606 project beyond a frame 608 that illustrates the original position of the structure 604 corresponding to the structure 606.

The corrected data are used to produce a mask. The corners of the structures in the corrected layout are not rounded.

Having described the invention, and a preferred embodiment thereof, what we claim as new and secured by letters patent is:

1. A method for generating mask layout data for lithography simulation, in which original data that define an original layout are prescribed, new data that define a new layout are automatically calculated proceeding from the original data, and in which the new layout is more similar, with regard to the geometry, to a mask that is produced or can be produced using the original data than to the original layout, wherein the new data are calculated on the basis of rules that are based on deviations in the geometry of a layout from a mask that is produced according to this layout or a mask that is modeled proceeding from this layout with simulation of the steps of the production process, the rules containing geometric calculation specifications for defining the boundaries of a structure at a position of the new layout depending on the length and/or the area of a reference structure located at the same position in the original layout and/or depending on the distance between the reference structure and adjacent structures.

2. The method of claim 1, wherein, in accordance with a rule, a shortening value is determined for an elongate reference structure at a position of the original layout, and wherein, depending on the shortening value, the structure located at the same position in the new layout is shortened in a longitudinal direction in comparison with the reference structure.

3. The method of claim 2, wherein, in accordance with a correction rule, depending on the shortening value, a lengthening value is determined for a reference structure at a position of the original layout, and wherein, depending on the lengthening value, the structure located at the same position in the corrected layout is lengthened in the longitudinal direction in comparison with the structure located at the same position in the new layout.

4. The method of claim 1, wherein, in accordance with a rule, a cornered reference structure is determined at a position of the original layout, wherein at least one radius-of-curvature value for rounding a corner is determined or prescribed, and wherein, depending on the radius-of-curvature value, the structure located at the same position in the new layout has a rounded edge profile instead of the corner.

5. The method of claim 4,
wherein, in accordance with a correction rule, depending on the radius-of-curvature value, a lengthening value is determined for a reference structure at a position of the original layout, and
wherein, depending on the lengthening value, the structure located at the same position in the corrected layout is lengthened in a longitudinal direction and/or widened in a transverse direction in comparison with the structure located at the same position in the new layout.

6. The method of claim 4, wherein, in the case of a light-absorbing structure located around a light-transmissive structure, an inner corner is rounded with a smaller radius than an outer corner of the light-absorbing structure.

7. The method of claim 6,
wherein, in accordance with a correction rule, depending on a constriction value, a widening value is determined for a reference structure at a position of the original layout, and
wherein, depending on the widening value, the structure located at the same position in the corrected layout is widened at least in sections transversely with respect to the longitudinal direction in comparison with the structure located at the same position in the new layout.

8. The method of claim 1, wherein,
in accordance with a rule, a constriction value is determined for an elongate reference structure at a position of the original layout, and
wherein, depending on the constriction value, the structure located at the same position in the new layout is constricted at least in sections transversely with respect to a longitudinal direction in comparison with the reference structure.

9. A data-processing system for generating mask layout data, said data-processing system being configured to implement the method recited in claim 1.

10. A computer-readable medium having encoded thereon instructions for causing a data processing system to execute a command sequence implementing method steps of claim 1.

11. An integrated circuit structure comprising a circuit structure produced using a mask based on data generated with the aid of a method of claim 1.

12. A method for generating optimized mask layout data for photomasks,
in which original data that define an original layout are prescribed,
in which new data that define a new layout are calculated proceeding from the original data, the new data being calculated on the basis of correction rules based on deviations in the geometry of a layout from a mask produced according to this layout or a mask that is modeled proceeding from this layout with simulation of the production process;
wherein, in accordance with a correction rule, depending on a shortening value, a lengthening value is determined for a reference structure at a position of the original layout, and
wherein, depending on the lengthening value, the structure located at the same position in the corrected layout is lengthened in a longitudinal direction in comparison with the structure located at the same position in the new layout, and
in which the geometry of the new layout is more similar to a mask that is produced or can be produced using the original data than to the original layout,
wherein corrected data of a corrected layout are automatically defined proceeding from the new data in such a way that a corrected mask that is produced or can be produced using the corrected data is more similar, with regard to the geometry, to the original layout than to a mask that is produced or can be produced using the original data, and/or
wherein the corrected mask that is produced or can be produced using the corrected data has lithographic properties that differ from those of a mask that is produced or can be produced using the original data.

13. The method of claim 12, wherein the ratio of the dark areas and of the bright areas of the original layout is preserved in the corrected layout or is changed by a prescribed value.

14. The method of claim 12,
wherein, in accordance with a correction rule, depending on the radius-of-curvature value, a lengthening value is determined for a reference structure at a position of the original layout, and
wherein, depending on the lengthening value, the structure located at the same position in the corrected layout is lengthened in the longitudinal direction and/or widened in the transverse direction in comparison with the structure located at the same position in the new layout.

15. The method of claim 12,
wherein, in accordance with a correction rule, depending on the constriction value, a widening value is determined for a reference structure at a position of the original layout,
and wherein, depending on the widening value, the structure located at the same position in the corrected layout is widened at least in sections transversely with respect to the longitudinal direction in comparison with the structure located at the same position in the new layout.

16. The method of claim 12, wherein the lengthening and/or the widening is implemented essentially while maintaining the form of the structure in the original layout.

17. The method of claim 12, wherein simple structures are attached in the course of the lengthening and/or widening.

18. A method for generating mask layout data for lithography simulation, said method comprising:
prescribing original data defining an original layout of a mask;
determining a deviation between said original layout and a subsequent layout of a mask derived from said original layout; and
on the basis of said deviation, calculating new data defining a new layout, said new layout being more similar to said subsequent layout that it is to said original layout.

19. The method of claim 18, wherein determining a deviation comprises simulating lithographic processing steps to obtain said subsequent layout.

20. The method of claim 18, wherein determining a deviation comprises performing lithographic processing steps to obtain said subsequent layout.

21. The method of claim 18, wherein calculating new data comprises applying a rule defining, on the basis of a geometric parameter associated with a reference structure on said original layout, a corresponding structure on said new layout.

22. The method of claim 21, further comprising selecting said geometric parameter from the group consisting of: an area of said reference structure; a length of said reference structure; a separation between said reference structure and a proximate structure on said original layout; a position of said reference structure on said original layout; and a shape of said reference structure.

23. The method of claim 21, wherein, applying a rule comprises
    determining a scaling value for said reference structure on said original layout, and
    scaling said corresponding structure on said new layout by in a manner dependent on said scaling value.

24. The method of claim 23, wherein determining a scaling value comprises determining a shortening value.

25. The method of claim 23, wherein determining a scaling value comprises determining a lengthening value.

26. The method of claim 21, wherein applying a rule comprises:
    determining at least one radius-of-curvature value for rounding a corner of said reference structure, and
    rounding a corresponding corner of said corresponding structure by an amount dependent on said at least one radius-of-curvature value.

27. The method of claim 26, further comprising
    determining, on the basis of said radius-of-curvature value, a scaling value for said reference structure, and
    scaling said corresponding structure on said new layout in a manner dependent on said scaling value.

28. The method of claim 26, wherein, in the case of a light-absorbing structure located around a light-transmissive structure, an inner corner is rounded with a smaller radius than an outer corner of the light-absorbing structure.

29. The method of claim 21, wherein applying a rule comprises:
    determining a constriction value for said reference structure on said original layout, and
    constricting said corresponding structure on said new layout in a manner dependent on said constriction value.

30. A method for generating optimized mask layout data for photomasks,
    in which original data that define an original layout are prescribed,
    in which new data that define a new layout are calculated proceeding from the original data, the new data being calculated on the basis of correction rules based on deviations in the geometry of a layout from a mask produced according to this layout or a mask that is modeled proceeding from this layout with simulation of the production process;
    wherein, in accordance with a correction rule, depending on a radius-of-curvature value, a lengthening value is determined for a reference structure at a position of the original layout, and
    wherein, depending on the lengthening value, the structure located at the same position in the corrected layout is lengthened in a longitudinal direction and/or widened in a transverse direction in comparison with the structure located at the same position in the new layout, and
    in which the geometry of the new layout is more similar to a mask that is produced or can be produced using the original data than to the original layout,
    wherein corrected data of a corrected layout are automatically defined proceeding from the new data in such a way that a corrected mask that is produced or can be produced using the corrected data is more similar, with regard to the geometry, to the original layout than to a mask that is produced or can be produced using the original data, and/or
    wherein the corrected mask that is produced or can be produced using the corrected data has lithographic properties that differ from those of a mask that is produced or can be produced using the original data.

31. The method of claim 30, wherein the ratio of the dark areas and of the bright areas of the original layout is preserved in the corrected layout or is changed by a prescribed value.

32. The method of claim 30,
    wherein, in accordance with a correction rule, depending on the shortening value, a lengthening value is determined for a reference structure at a position of the original layout, and
    wherein, depending on the lengthening value, the structure located at the same position in the corrected layout is lengthened in the longitudinal direction in comparison with the structure located at the same position in the new layout.

33. The method of claim 30,
    wherein, in accordance with a correction rule, depending on the constriction value, a widening value is determined for a reference structure at a position of the original layout,
    and wherein, depending on the widening value, the structure located at the same position in the corrected layout is widened at least in sections transversely with respect to the longitudinal direction in comparison with the structure located at the same position in the new layout.

34. The method of claim 30, wherein the lengthening and/or the widening is implemented essentially while maintaining the form of the structure in the original layout.

35. The method of claim 30, wherein simple structures are attached in the course of the lengthening and/or widening.

36. A method for generating optimized mask layout data for photomasks,
    in which new data that define an new layout are prescribed,
    in which new data that define a new layout are calculated proceeding from the new data, the new data being calculated on the basis of correction rules based on deviations in the geometry of a layout from a mask produced according to this layout or a mask that is modeled proceeding from this layout with simulation of the production process;
    wherein, in accordance with a correction rule, depending on a constriction value, a widening value is determined for a reference structure at a position of the new layout,
    and wherein, depending on the widening value, the structure located at the same position in a corrected layout is widened at least in sections transversely with respect to a longitudinal direction in comparison with the structure located at the same position in the new layout, and
    in which the geometry of the new layout is more similar to a mask that is produced or can be produced using the new data than to the new layout,
    wherein corrected data of a corrected layout are automatically defined proceeding from the new data in such a way that a corrected mask that is produced or can be produced using the corrected data is more similar, with regard to the geometry, to the new layout than to a mask that is produced or can be produced using the new data, and/or
    wherein the corrected mask that is produced or can be produced using the corrected data has lithographic properties that differ from those of a mask that is produced or can be produced using the new data.

37. The method of claim 36, wherein the ratio of the dark areas and of the bright areas of the new layout is preserved in the corrected layout or is changed by a prescribed value.

38. The method of claim 36,
wherein, in accordance with a correction rule, depending on the shortening value, a lengthening value is determined for a reference structure at a position of the new layout, and
wherein, depending on the lengthening value, the structure located at the same position in the corrected layout is lengthened in the longitudinal direction in comparison with he structure located at the same position in the new layout.

39. The method of claim 36,
wherein, in accordance with a correction rule, depending on the radius-of-curvature value, a lengthening value is determined for a reference structure at a position of the new layout, and
wherein, depending on the lengthening value, the structure located at the same position in the corrected layout is lengthened in the longitudinal direction and/or widened in the transverse direction in comparison with the structure located at the same position in the new layout.

40. The method of claim 36, wherein the lengthening and/or the widening is implemented essentially while maintaining the form of the structure in the new layout.

41. The method of claim 36, wherein simple structures are attached in the course of the lengthening and/or widening.

* * * * *